US008975763B2

(12) United States Patent
Sugimura et al.

(10) Patent No.: US 8,975,763 B2
(45) Date of Patent: Mar. 10, 2015

(54) SEMICONDUCTOR MEMORY DEVICE AND METHOD OF MANUFACTURING THE SAME

(71) Applicant: Kabushiki Kaisha Toshiba, Minato-ku (JP)

(72) Inventors: Misa Sugimura, Kanagawa (JP); Toshiro Yokoyama, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/278,121

(22) Filed: May 15, 2014

(65) Prior Publication Data
US 2014/0376169 A1  Dec. 25, 2014

(30) Foreign Application Priority Data

Jun. 20, 2013  (JP) ................. 2013-130031

(51) Int. Cl.
H01L 23/544 (2006.01)
H01L 23/12 (2006.01)
G06F 1/16 (2006.01)

(52) U.S. Cl.
CPC . H01L 23/12 (2013.01); G06F 1/16 (2013.01)
USPC .......................... 257/797; 257/678

(58) Field of Classification Search
USPC .......................... 257/739, 797, 678
See application file for complete search history.

(56) References Cited

U.S. PATENT DOCUMENTS

| 6,400,037 B1 * | 6/2002 | Omizo .......................... 257/797 |
| 8,492,240 B2 * | 7/2013 | Mueller et al. ................ 438/401 |
| 2006/0087016 A1 | 4/2006 | Wada et al. |
| 2008/0076208 A1 * | 3/2008 | Wu et al. ....................... 438/109 |
| 2008/0173995 A1 | 7/2008 | Kuratomi et al. |
| 2014/0225230 A1 * | 8/2014 | Kim ............................. 257/620 |

FOREIGN PATENT DOCUMENTS

| JP | 2001-312708 | 11/2001 |
| JP | 2006-119983 | 5/2006 |
| JP | 2008-84263 | 4/2008 |

* cited by examiner

Primary Examiner — S. V. Clark
(74) Attorney, Agent, or Firm — Oblon, Spivak, McClelland, Maier & Neustadt, L.L.P.

(57) ABSTRACT

According to one embodiment, a semiconductor memory device includes an electrical terminal disposed in a first side; a first surface including a first part, a second part, and a third part, a mark of the semiconductor memory device being printed in the first part, the second part being disposed in a second side, the second side being opposite side of the first side, the third part being disposed around the first part, a first surface roughness of the first part being higher than a second surface roughness of the third part.

10 Claims, 10 Drawing Sheets

SEMICONDUCTOR MEMORY DEVICE AND METHOD OF MANUFACTURING THE SAME

CROSS-REFERENCE TO RELATED APPLICATION

This application is based upon and claims the benefit of priority from Japanese Patent Application No. 2013-130031, filed Jun. 20, 2013; the entire contents of which are incorporated herein by reference.

FIELD

Embodiments described herein relate generally to a semiconductor memory device and a method of manufacturing the semiconductor memory device.

BACKGROUND

A semiconductor memory device such as SD cards is desired to be smoothly inserted into and extracted from card socket of a host device.

DETAILED DESCRIPTION

Figure 1:
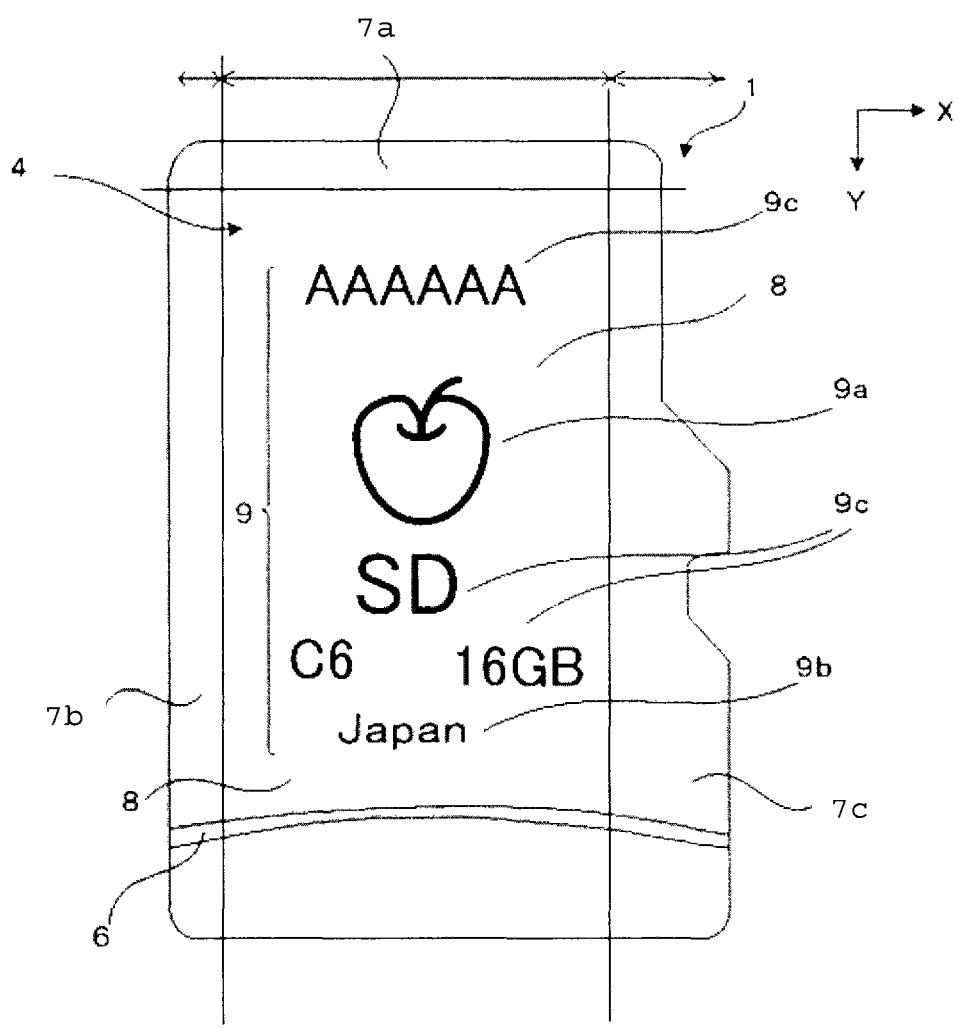
FIG. 1 is a plan view illustrating a semiconductor memory device according to a first embodiment.

In general, according to one embodiment, a semiconductor memory device includes an electrical terminal disposed in a first side; a first surface including a first part, a second part, and a third part, a mark of the semiconductor memory device being printed in the first part, the second part being disposed in a second side, the second side being opposite side of the first side, the third part being disposed around the first part, a first surface roughness of the first part being higher than a second surface roughness of the third part.

Various embodiments will be described hereinafter with reference to the accompanying drawings. The drawings are schematic or conceptual, and the relationships between the thickness and width of portions, the size ratio among portions, etc., are not necessarily the same as the actual values thereof. Further, the dimensions and proportions may be illustrated differently among drawings, even for identical portions.

In the specification and drawings, the same elements as those described previously with reference to earlier figures are labeled with like reference numerals, and the detailed description is omitted as appropriate.

(First Embodiment)

In the following embodiment, a semiconductor memory device 1 will be described by using a micro SD card as an example. Hereinafter, the semiconductor memory device will be referred to as the memory card. However, the memory card in the following description is not limited to the micro SD card. The descriptions of this specification may be applied to any memory card such as USB card and so on.

Figure 2:
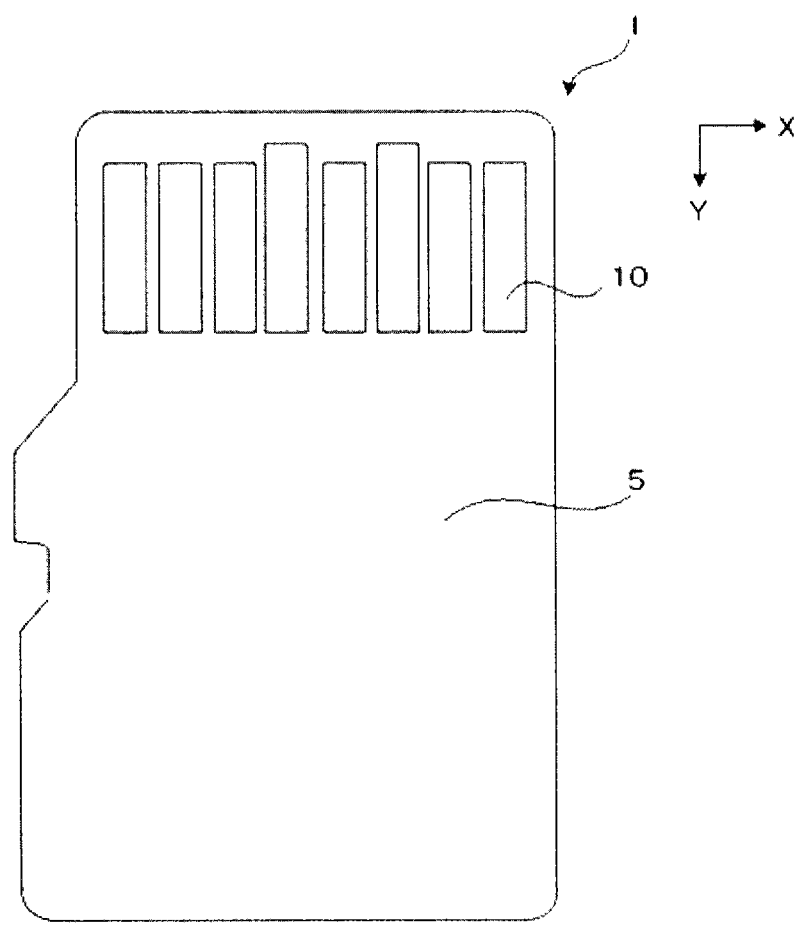
FIG. 2 is a plan view illustrating the semiconductor memory device according to the first embodiment.

FIGS. 1 and 2 are plan views illustrating the external appearance of the semiconductor memory device 1 of the first embodiment. As shown in the drawings, the semiconductor memory device 1 includes a memory chip, a controller chip, a plurality of components, and mold resin 2 (resin). The mold resin 2 is made of an insulating material, and covers the memory chip, the controller chip, and the plurality of components.

The semiconductor memory device 1 has a first surface and a second surface 5 facing each other. A plurality of electrical terminals 10 are disposed in the second surface 5. The electrical terminals 10 are disposed in a first side.

The first surface 4 includes a first peripheral part 6, a second peripheral part 7, and a central part 8. The central part 8 is surrounded by the second peripheral part 7. That is, the second peripheral part 7 is disposed around the central part 8. The shape of the second peripheral part 7 is U-shape for example. The second peripheral part 7 includes a first part 7a, a second part 7b, and a third part 7c. The first part 7a is disposed in the first side. That is, the first part 7a faces the electrical terminals 10 via the mold resin 2. The second part 7b is disposed to be adjacent to the central part 8. Similarly, the third part 7c is disposed to be adjacent to the central part 8. The central part 8 is disposed between the second part 7b and the third part 7c.

A surface roughness Ra of the second peripheral part 7 is lower than the surface roughness of the central part 8. That is, a surface roughness Ra of the first part 7a is lower than that of the central part 8. A surface roughness Ra of the second part 7b is lower than that of the central part 8. A surface roughness Ra of the third part 7c is lower than that of the central part 8. However it is not necessary that surface roughness Ra of all parts 7a to 7c is lower than that of the central part 8. At least one of the surface roughness Ra of parts 7a to 7c is lower than that of the central part 8.

The second peripheral part 7 is smoother than the central part 8. It may be preferable that the surface roughness Ra of the second peripheral part 7 may be equal to or less than 1.2. It may be preferable that the surface roughness of the central part may be equal to or more than 1.8.

A definition of the surface roughness Ra is described in ASME B46.1-2002.

On the central part 8, there are mark 9 such as an logo mark 9a, a country-of-origin label 9b, and an identification code 9c printed by a laser and ink. A printing way is not limited to the laser and ink. Of course, another printing ways (for example, inkjet and so on) are applied to this memory card. The higher the surface roughness Ra of the central part 8, the better. Therefore, adhesion between the ink of the mark 9 and the mold resin 2 is improved because the surface roughness Ra of the central part 8 is higher than the surface roughness Ra of the second peripheral part 7.

Meanwhile, on the second surface 5, a plurality of electrical terminals 10 (in the drawings, 8 electrical terminals are illustrated for example) is arranged along the X axis direction of the semiconductor memory device 1. Also, the electrical terminals 10 are not covered by the mold resin 2, and are capable of connecting a host device in a case where the semiconductor memory device 1 is inserted into the host device.

Figure 3:
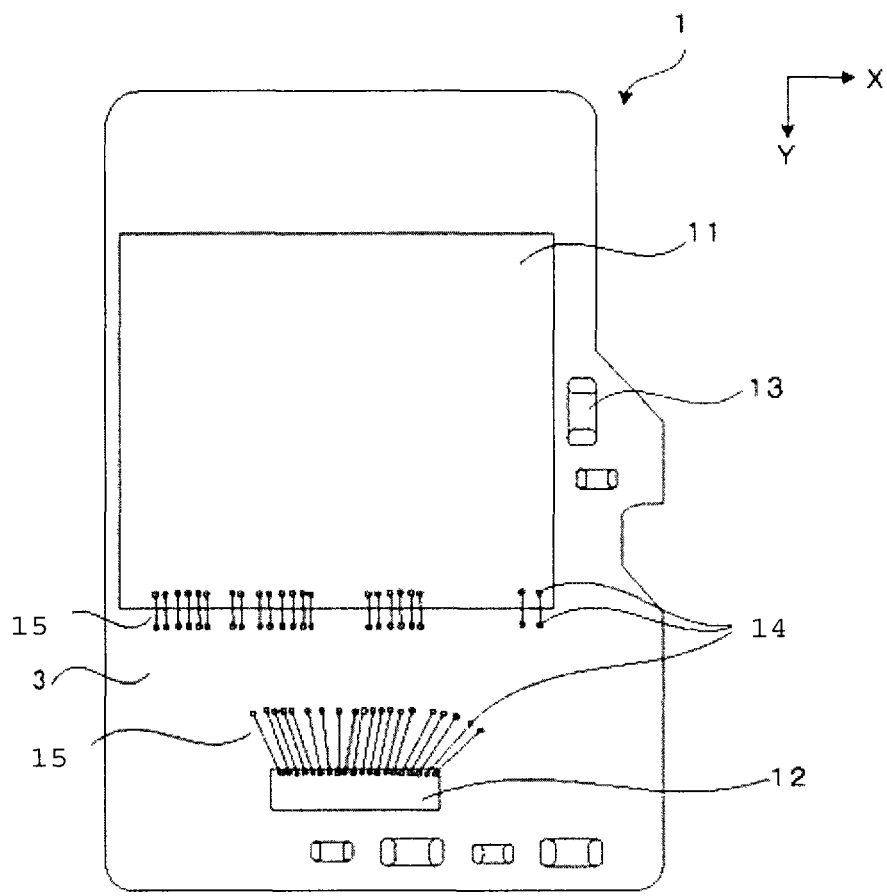
FIG. 3 is a plan view illustrating the semiconductor memory device according to the first embodiment.
Figure 4:
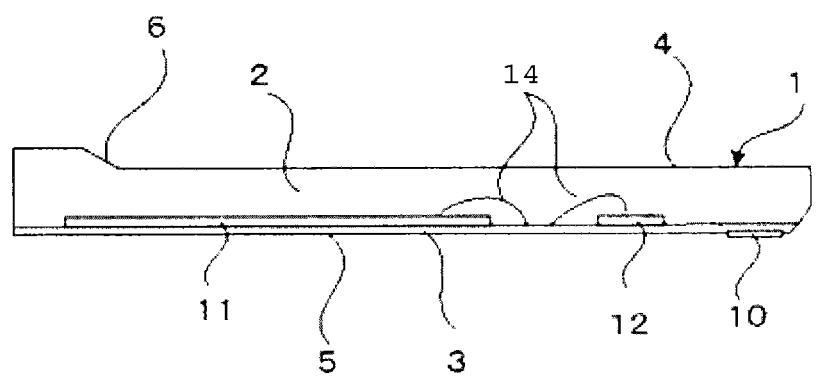
FIG. 4 is a cross-sectional view illustrating the semiconductor memory device according to the first embodiment.

FIGS. 3 and 4 are a plan view and a cross-sectional view illustrating the internal structure of the semiconductor memory device 1 of the first embodiment, respectively. For a ease of explanation, the mold resin 2 is omitted in FIG. 3 and electrical components 13 are omitted in FIG. 4.

As shown in FIG. 3, the semiconductor memory device 1 includes at least the mold resin 2, the substrate 3, a memory chip 11, a controller chip 12, and the electrical components 13.

Also, the semiconductor memory device 1 includes a plurality of connection pads 14 and a plurality of conductive wires 15. On the substrate 3, a plurality of connection pads 14 are capable of electrically connecting to electric circuits (for example that circuit includes a plurality of transistors) in the memory chip 11. The connection pads 14 are electrically connected to the substrate 3 via conductive wires 15.

Also, examples of the electrical components 13 include resistors, capacitors, and inductors. Also, on the controller chip 12, a plurality of connection pads 14 of the controller chip 12 are capable of electrically connecting to electric circuits of the controller chip 12. The connection pads 14 of the controller chip 12 are electrically connected to the substrate 3 via conductive wires 15.

Figure 5:
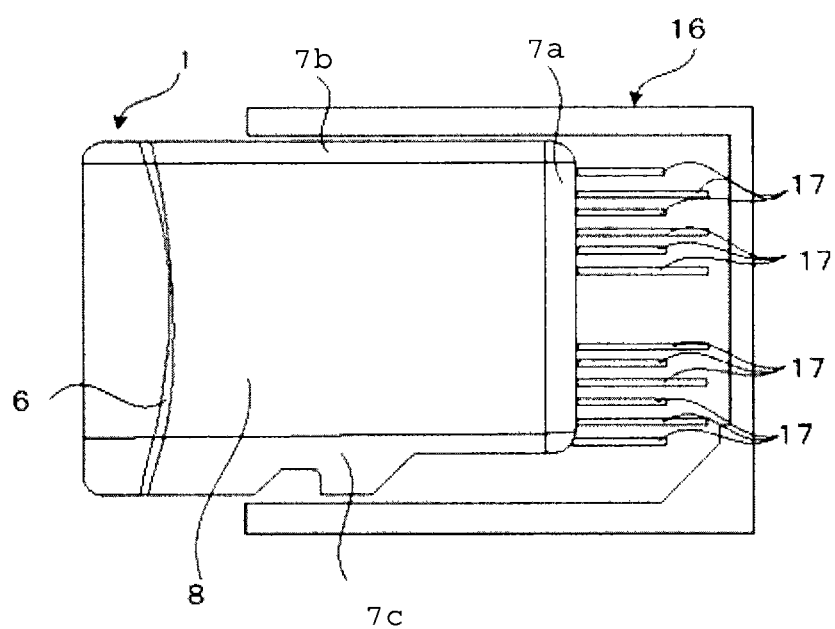
FIG. 5 is a plan view illustrating the semiconductor memory device according to the first embodiment.
Figure 6:
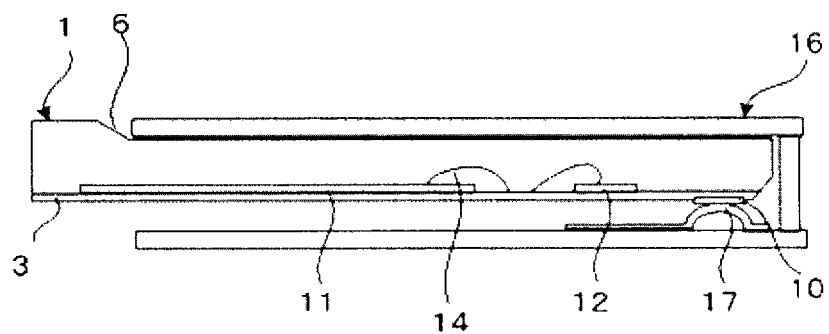
FIG. 6 is a cross-sectional view illustrating the semiconductor memory device according to the first embodiment.

FIGS. 5 and 6 are a plan view and a cross-sectional view illustrating the semiconductor memory device 1 of the first embodiment, respectively. FIG. 5 shows a plan view when the semiconductor memory device 1 is inserted into a card socket 16 of the host device. FIG. 6 is a cross-sectional view when the semiconductor memory device 1 is inserted in the card socket of the host device. As shown in FIG. 5, when the semiconductor memory device 1 is inserted in the card socket 16, the semiconductor memory device 1 is fixed in the card socket 16 by connector pins 17, and the second peripheral part 7 is in contact with an inside surface of the card socket 16.

The effects of the semiconductor memory device 1 of the first embodiment will be described. In this embodiment, the surface roughness Ra of the central part 8 is higher than the surface roughness Ra of the second peripheral part 7. Therefore, the frictional force of the second peripheral part 7 is less than the frictional force of the central part 8. As the result, the semiconductor memory device 1 may be smoothly inserted into and extracted from the card socket 16 and the adhesion between the ink of the mark 9 and the mold resin 2 is improved. It is possible to prevent the semiconductor memory device 1 from being strongly held in the card socket 16. We consider a case of extracting the semiconductor memory device 1 strongly held in the card socket 16 as a comparative example. In this case, the electrical terminals 10 or the substrate 3 may be bent or folded because strong force may need in order to extract the semiconductor memory device 1 from the card socket 16.

Also, the adhesion between ink of the mark 9 and the mold resin 2 is improved because the surface roughness Ra of the central part 8 is higher than the surface roughness Ra of the second peripheral part 7. It becomes easy to print the mark 9 such as the logo 9a, the country-of-origin label 9b, and the identification code 9c. Therefore, it becomes easy to manage life time of the semiconductor memory device 1.

Also, in the present embodiment, the color of the ink which is applied all over the semiconductor memory device 1 is not limited to black. For example, the color of the ink may be red, yellow, green, blue, or white. Therefore, the design property may improve.

(Second Embodiment)

Figure 7:
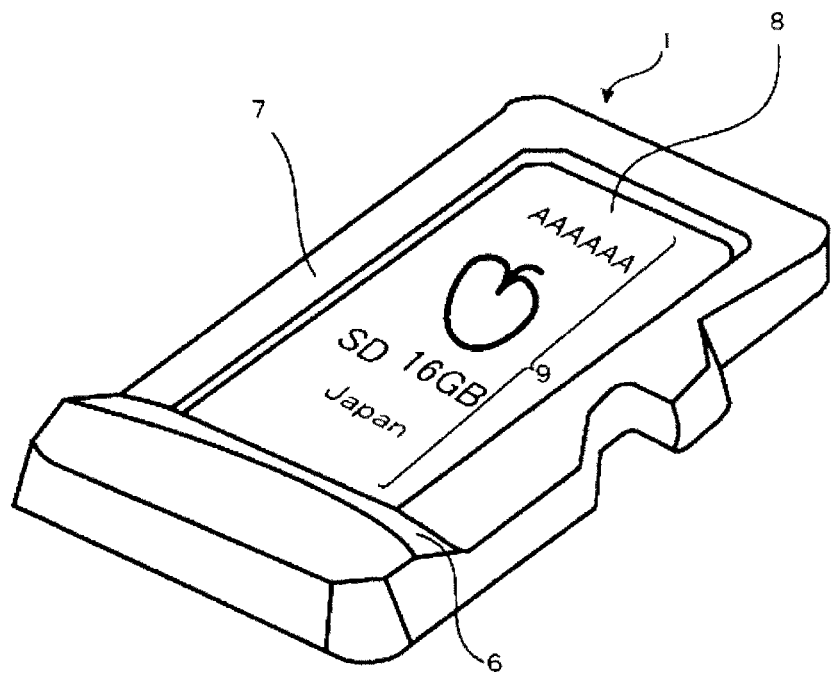
FIG. 7 is a perspective view illustrating the external appearance of a semiconductor memory device according to a second embodiment.

A semiconductor memory device 1 of a second embodiment will be described. FIG. 7 is a perspective view illustrating the external appearance of the semiconductor memory device 1 of the second embodiment. The central part 8 is thinner than the second peripheral part 7. The difference in surface roughness between the central part 8 and the second peripheral part 7 is the same as that in the first embodiment. the surface roughness of the central part 8 may be the same as the surface roughness of the second peripheral part 7.

Figure 8:
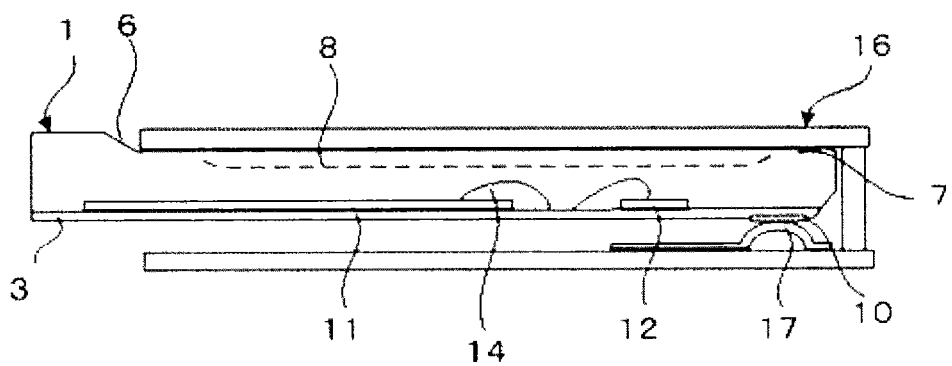
FIG. 8 is a cross-sectional view illustrating the semiconductor memory device according to the second embodiment.

FIG. 8 is a cross-sectional view illustrating the semiconductor memory device 1 of the second embodiment. As shown in FIG. 8, since the central part 8 is dented as compared to the second peripheral part 7, when the semiconductor memory device 1 is inserted in the card socket 16, the second peripheral part 7 becomes likely to be in contact with the inside surface of the card socket 16.

In the present embodiment, when the semiconductor memory device 1 is extracted from the card socket 16, the central part 8 becomes unlikely to come into contact with the inside surface of the card socket 16. Therefore, the central part 8 and the mark 9 of the semiconductor memory device 1 become unlikely to be worn down. That is, since the central part 8 and the mark 9 are unlikely to be scratched, it is possible to stably keep the mark 9 printed on the central part 8, and thus it becomes easy to manage life time of the semiconductor memory device 1.

Also, even if the surface roughness of the central part 8 is large, since the central part 8 is unlikely to come into contact with the card socket 16, it becomes easier to insert into the card socket 16 and extract the semiconductor memory device 1 from the card socket 16.

Figure 9:
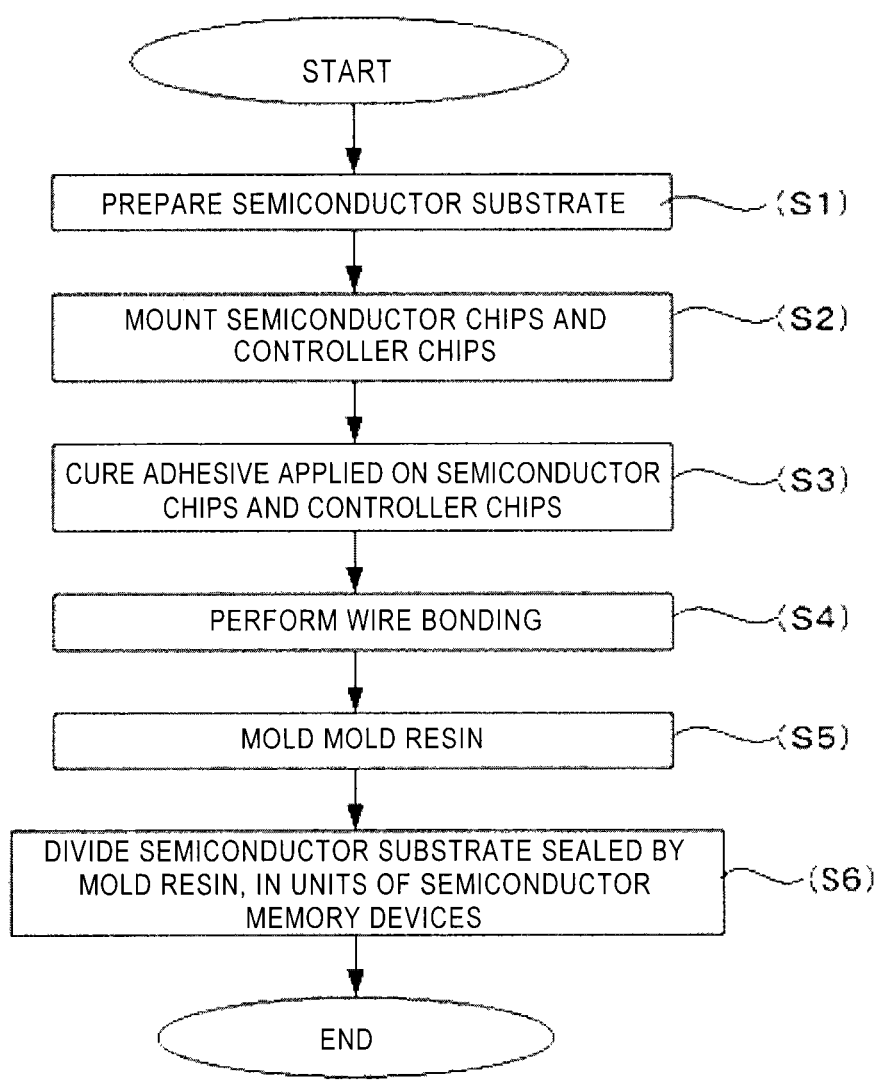
FIG. 9 is a flow chart illustrating a process of manufacturing the semiconductor memory device according to the second embodiment.

A process of manufacturing the semiconductor memory device 1 will be described. FIG. 9 is a flow chart illustrating the process of manufacturing the semiconductor memory device 1 of the second embodiment.

First, in STEP S1, a substrate 3 is prepared.

Next, in STEP S2, memory chip 11 and controller chips 12 are mounted on the substrate 3 via the adhesive material.

Subsequently, in STEP S3, the adhesive material is cured.

Next, in STEP S4, the conductive wires 15 are bonded, thereby the memory chip 11 is electrically connected to the substrate 3. And the controller chip 12 is electrically connected to the substrate 3.

Figure 10:
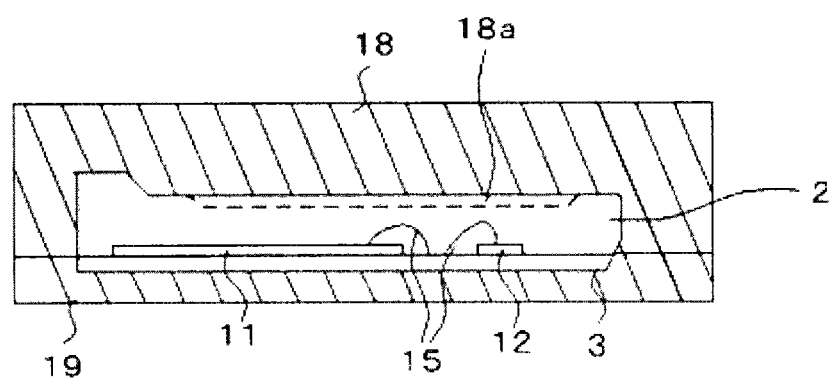
FIG. 10 is a cross-sectional view illustrating the process of manufacturing the semiconductor memory device according to the second embodiment.

Subsequently, in STEP S5, the substrate 3, the memory chip 11, and the like are covered by the molding resin 2. FIG. is a cross-sectional view illustrating the process of manufacturing the semiconductor memory device 1 of the second embodiment. As shown in FIG. 10, a mold apparatus includes a first apparatus 18 and a second apparatus 19. The semiconductor memory device 1 is made by the first apparatus 18 and the second apparatus 19. The first apparatus 18 includes a protruding part 18a. The central part 8 is made by the protruding part 18a. Therefore, when the mold resin is molded by the first apparatus 18 and the second apparatus 19, it is possible to form a step between the second peripheral part 7 and the central part 8.

Next, in STEP S6, the substrate 3 molded by the mold resin 2 is divided in units of semiconductor memory devices 1 by dicing, thereby manufacturing the semiconductor memory devices 1. In this process, it is possible to manufacture a plurality of semiconductor memory devices 1 from one frame. Also, for dividing into the semiconductor memory devices 1, besides dicing, other methods may be used. For example, a laser may be used for dividing.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    an electrical terminal disposed in a first side;
    a first surface including a first part, a second part, and a third part, a mark of the semiconductor memory device being printed in the first part, the second part being disposed in a second side, the second side being opposite side of the first side, the third part being disposed around the first part, a first surface roughness of the first part being higher than a second surface roughness of the third part.

2. The semiconductor memory device according to claim 1, wherein the first surface roughness is equal to or more than 1.8.

3. The semiconductor memory device according to claim 1, wherein the second surface roughness is equal to or less than 1.2.

4. The semiconductor memory device according to claim 2, wherein the second surface roughness is equal to or less than 1.2.

5. The semiconductor memory device according to claim 3, wherein a thickness of the third part is larger than a thickness of the first part.

6. The semiconductor memory device according to claim 4, wherein a thickness of the third part is larger than a thickness of the first part.

7. The semiconductor memory device according to claim 5, further comprising:
    a substrate;
    a memory chip mounted on the substrate;
    a controller chip mounted on the substrate.

8. The semiconductor memory device according to claim 6, further comprising:
    a substrate;
    a memory chip mounted on the substrate;
    a controller chip mounted on the substrate.

9. The semiconductor memory device according to claim 7, further comprising:
    a first wiring electrically connected to the substrate and the memory chip;
    a second wiring electrically connected to the substrate and the controller chip.

10. The semiconductor memory device according to claim 8, further comprising:
    a first wiring electrically connected to the substrate and the memory chip;
    a second wiring electrically connected to the substrate and the controller chip.

* * * * *